US012689006B2

(12) United States Patent
Kako et al.

(10) Patent No.: US 12,689,006 B2
(45) Date of Patent: Jul. 21, 2026

(54) ETCHING METHOD AND PLASMA PROCESSING APPARATUS

(71) Applicant: Tokyo Electron Limited, Tokyo (JP)

(72) Inventors: Takashi Kako, Kurokawa-gun (JP); Ryu Nagai, Kurokawa-gun (JP); Koki Tanaka, Kurokawa-gun (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 224 days.

(21) Appl. No.: 18/070,469

(22) Filed: Nov. 29, 2022

(65) Prior Publication Data

US 2023/0170189 A1 Jun. 1, 2023

(30) Foreign Application Priority Data

Nov. 30, 2021 (JP) ................................. 2021-193985

(51) Int. Cl.
| | |
|---|---|
| *H10P 50/00* | (2026.01) |
| *H01J 37/32* | (2006.01) |
| *H10P 50/24* | (2026.01) |
| *H10P 50/26* | (2026.01) |
| *H10P 50/28* | (2026.01) |

(52) U.S. Cl.
CPC .. *H01J 37/32495* (2013.01); *H01J 37/32449* (2013.01); *H01J 37/3255* (2013.01); *H01J 37/32568* (2013.01); *H10P 50/242* (2026.01); *H10P 50/268* (2026.01); *H10P 50/283* (2026.01); *H10P 50/73* (2026.01); *H01J 2237/3321* (2013.01); *H01J 2237/3341* (2013.01)

(58) Field of Classification Search
CPC .... H01J 37/00–36; H01J 2237/00–339; H01L 21/00–86
See application file for complete search history.

(56) References Cited

U.S. PATENT DOCUMENTS

| | | | |
|---|---|---|---|
| 6,071,573 A | 6/2000 | Koemtzopoulos et al. | |
| 6,825,130 B2 * | 11/2004 | Todd ................... | H01L 21/0228 |
| | | | 438/778 |
| 10,800,092 B1 * | 10/2020 | Cheng ............... | H01J 37/32972 |
| 2012/0028454 A1 * | 2/2012 | Swaminathan ....... | C23C 16/045 |
| | | | 118/704 |
| 2016/0163557 A1 * | 6/2016 | Hudson ............. | H01J 37/32715 |
| | | | 156/345.24 |
| 2018/0096842 A1 * | 4/2018 | Varadarajan ...... | H01L 21/02126 |

(Continued)

FOREIGN PATENT DOCUMENTS

| | | |
|---|---|---|
| JP | 2009-188257 A | 8/2009 |
| JP | 2016-066801 A | 4/2016 |

(Continued)

*Primary Examiner* — Duy Vu N Deo
*Assistant Examiner* — Andrew Keelan Laobak
(74) *Attorney, Agent, or Firm* — XSENSUS LLP

(57) ABSTRACT

A disclosed etching method includes (a) forming a protective film containing carbon on a surface in a chamber of a plasma processing apparatus. The etching method further includes (b) etching an etch film of a substrate with plasma generated from an etching gas that includes a hydrogen fluoride gas and a hydrofluorocarbon gas within the chamber. The substrate includes the etch film, which is a silicon-containing film, and a mask containing carbon and provided on the etch film.

13 Claims, 9 Drawing Sheets

(56)          References Cited

U.S. PATENT DOCUMENTS

| | | | | |
|---|---|---|---|---|
| 2018/0226259 A1* | 8/2018 | Choi | ................. | H01J 37/32091 |
| 2020/0402805 A1* | 12/2020 | Aoki | ................. | H01L 21/02115 |
| 2021/0233777 A1* | 7/2021 | Sasagawa | ......... | H01L 21/32139 |
| 2021/0343539 A1* | 11/2021 | Suda | ................. | H01J 37/32449 |

FOREIGN PATENT DOCUMENTS

| | | | |
|---|---|---|---|
| JP | 2016-076625 A | 5/2016 |
| JP | 2020-136669 A | 8/2020 |
| JP | 2020-205361 A | 12/2020 |
| JP | 2021-506126 A | 2/2021 |
| KR | 10-2020-0100555 A | 8/2020 |
| WO | 2019/113351 A1 | 6/2019 |

* cited by examiner

DISTANCE IN THICKNESS DIRECTION OF
PROTECTIVE FILM FROM SURFACE IN CHAMBER

TIME

ETCHING METHOD AND PLASMA PROCESSING APPARATUS

CROSS-REFERENCE TO RELATED APPLICATIONS

This application is based on and claims the benefit of priority from Japanese Patent Application No. 2021-193985 filed on Nov. 30, 2021, the entire contents of which are incorporated herein by reference.

FIELD

Exemplary embodiments of the present disclosure relate to an etching method and a plasma processing apparatus.

BACKGROUND

A plasma processing apparatus is used in plasma processing such as etching. The plasma processing apparatus is provided with a chamber. A surface in the chamber is exposed to reactive species that are used for plasma processing, and damaged by the reactive species. In order to protect the surface in the chamber from the reactive species, a technique for forming a protective film on the surface in the chamber is used before the plasma processing is performed on a substrate. Japanese Unexamined Patent Publication No. 2016-76625, Japanese Unexamined Patent Publication No. 2009-188257, and U.S. Pat. No. 6,071,573 disclose such a technique.

SUMMARY

In an embodiment, an etching method is provided. The etching method includes (a) forming a protective film containing carbon on a surface in a chamber of a plasma processing apparatus. The etching method further includes (b) etching an etch film of a substrate with plasma generated from an etching gas including a hydrogen fluoride gas and a hydrofluorocarbon gas within the chamber. The substrate includes the etch film, which is a silicon-containing film, and a mask containing carbon and provided on the etch film.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Figure 1:
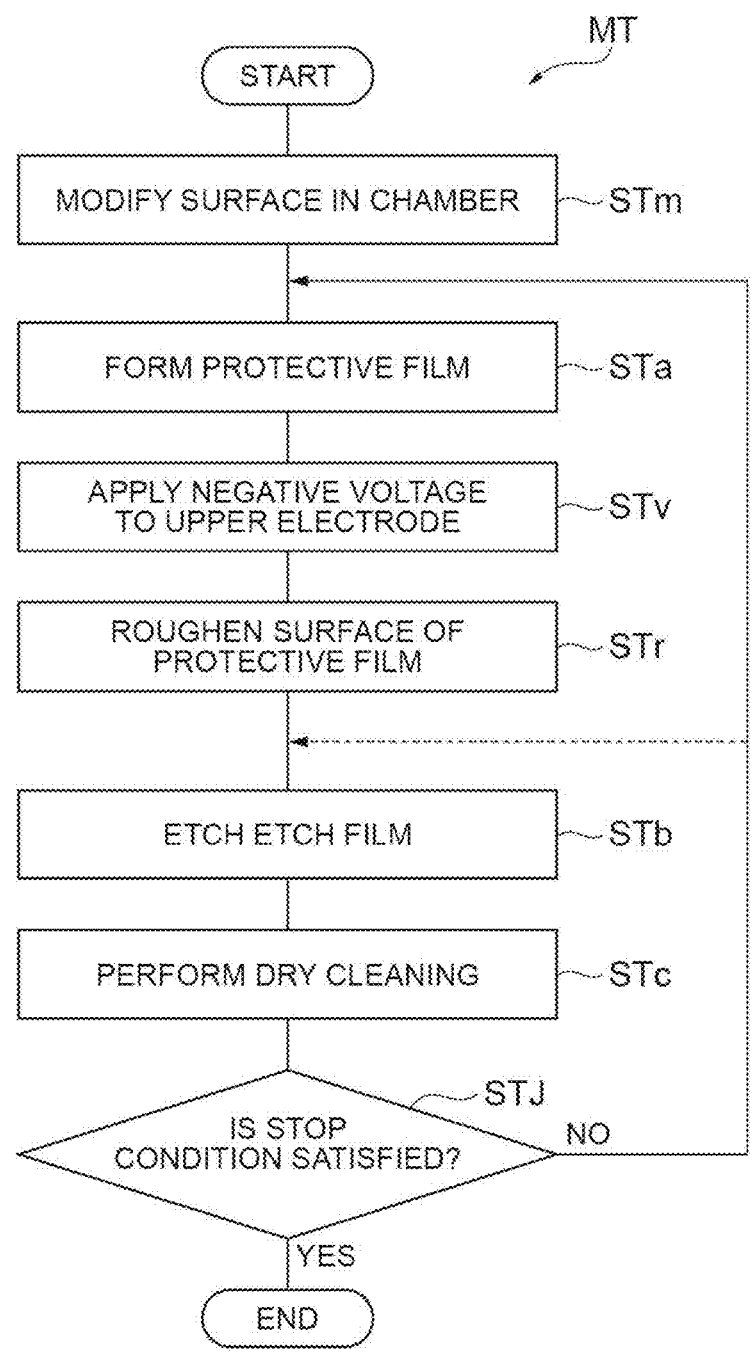
FIG. 1 is a flow chart of an etching method according to an exemplary embodiment.

Hereinafter, various exemplary embodiments will be described.

In an embodiment, an etching method is provided. The etching method includes (a) forming a protective film containing carbon on a surface in a chamber of a plasma processing apparatus. The etching method further includes (b) etching an etch film of a substrate with plasma generated from an etching gas including a hydrogen fluoride gas and a hydrofluorocarbon gas within the chamber. The substrate includes the etch film, which is a silicon-containing film, and a mask containing carbon and provided on the etch film.

In the above embodiment, the protective film is formed on the surface in the chamber before etching of the etch film. Since the protective film is formed of the same type of material as a material of the mask, that is, a carbon-containing material, it is resistant to the etching. Therefore, according to the above embodiment, it becomes possible to more effectively protect the surface in the chamber from the reactive species.

In an embodiment, the protective film may be formed by using chemical vapor deposition using a carbon-containing gas, molecular layer deposition, or sputter deposition.

In an embodiment, the protective film may be a laminated film including two or more different films. In an embodiment, the protective film may include a first film containing silicon, and a second film containing carbon and formed on the first film In an embodiment, the protective film may have a carbon content that increases according to a distance in a thickness direction thereof from the surface in the chamber. In an embodiment, the protective film may be formed using a film-forming gas in the operation (a), and a ratio of a flow rate of a carbon-containing gas in the film-forming gas to a total flow rate of the film-forming gas may be increased with time in the operation (a).

In another embodiment, an etching method is provided. The etching method includes (a) forming a protective film containing carbon on a surface in a chamber of a plasma processing apparatus. The etching method further includes (b) etching an etch film of a substrate with plasma generated from an etching gas containing a hydrogen fluoride gas and a hydrogen-containing gas within the chamber. The substrate includes the etch film, and a mask provided on the etch film. The protective film is formed of a same type of material as a material of the mask.

In the above embodiment, the protective film is formed on the surface in the chamber before etching of the etch film. Since the protective film is formed of the same type of material as a material of the mask, it is resistant to the etching. Therefore, according to the above embodiment, it becomes possible to more effectively protect the surface in the chamber from the reactive species.

In an embodiment, the hydrogen-containing gas may include at least one selected from a group consisting of $H_2$, $CH_4$, $C_2H_2$, $C_4H_2F_6$, $CH_2F_2$, $CH_3F$, $CHF_3$, $H_2O$, HCl, HBr, and HI.

In an embodiment, the plasma processing apparatus may be a capacitively coupled plasma processing apparatus. The plasma processing apparatus may include a substrate support provided within the chamber and an upper electrode provided above the substrate support.

In an embodiment, a surface of the upper electrode on a side of an internal space of the chamber may be provided by a ceiling plate formed of silicon.

In an embodiment, the etching method may further include (c) applying a negative direct-current voltage to the upper electrode during the operation (a) or after the operation (a) and before the operation (b). According to the embodiment, the protective film is densified.

In an embodiment, the etching method may further include (d) modifying the surface in the chamber before the operation (a). According to the embodiment, adhesion of the protective film to the surface in the chamber is improved. In the operation (d), plasma is generated from a noble gas within the chamber after chamber cleaning, In an embodiment, the etching method may further include (e) performing roughening treatment of a surface of the protective film after the operation (a) and before the operation (b). According to the embodiment, adhesion of the reactive species generated in the operation (b) to the surface of the protective film is enhanced. In the operation (e), plasma may be generated from a hydrogen gas within the chamber.

In still another embodiment, a plasma processing apparatus is provided. The plasma processing apparatus includes a chamber, a gas supply, a plasma generator, and a controller. The gas supply is configured to supply a gas into the chamber. The plasma generator is configured to generate plasma from a gas within the chamber. The controller controls the gas supply to supply a film-forming gas into the chamber to form a protective film containing carbon on a surface in the chamber. The controller controls the gas supply and the plasma generator to generate plasma from an etching gas including a hydrogen fluoride gas and a hydrofluorocarbon gas to etch an etch film of a substrate within the chamber.

Hereinafter, various exemplary embodiments will be described in detail with reference to the drawings. In the drawings, the same or equivalent portions are denoted by the same reference symbols.

FIG. 1 is a flow chart of an etching method according to an exemplary embodiment. The etching method (hereinafter referred to as a "method MT") shown in FIG. 1 is performed to etch an etch film of a substrate.

Figure 2:
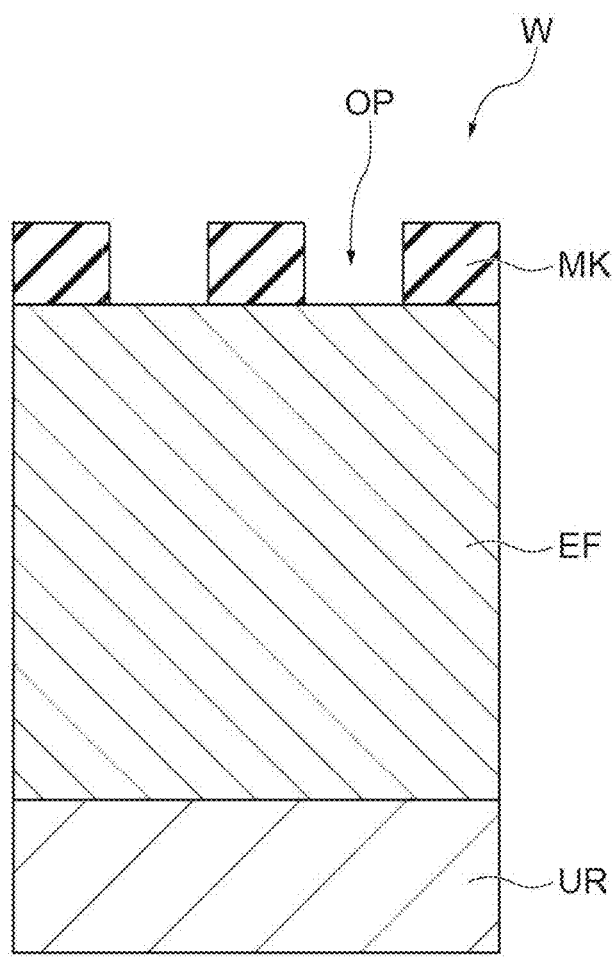
FIG. 2 is a partially enlarged sectional view of a substrate of an example.

FIG. 2 is a partially enlarged sectional view of a substrate of an example. The method MT may be applied to a substrate W shown in FIG. 2. The substrate W includes a film EF and a mask MK. The substrate W may further include an underlying region UR. The film EF may be provided on the underlying region UR.

The film EF is an etch film that is etched in the method MT. The film EF is, for example, a silicon-containing film. The silicon-containing film may be a monolayer film or a multilayer film. The monolayer film is, for example, a silicon oxide film, a silicon nitride film, a polycrystalline silicon film, or a silicon-containing low dielectric constant film. The multilayer film is formed of two or more films among a silicon oxide film, a silicon nitride film, and a polycrystalline silicon film. The multilayer film may be a laminated film that includes a silicon oxide film and a silicon nitride film. The film EF may be formed of other materials. For example, the film EF may be formed of metal.

The mask MK is provided on the film EF. The mask MK may be formed of any material as long as the film EF is selectively etched with respect to the mask MK. The mask MK may be formed of a carbon-containing film, for example, an organic film such as a photoresist film, an amorphous carbon film, or a spin-on carbon film. Alternatively, the mask MK may be formed of a silicon-containing film or a metal-containing film. The silicon-containing film is a polycrystalline silicon film or a silicon oxide film. The metal-containing film is formed of titanium, titanium nitride, titanium carbide, titanium oxide, tungsten, tungsten carbide, ruthenium, ruthenium oxide, molybdenum, molybdenum carbide, or the like. The mask MK has a pattern that is transferred to the film EF. That is, the mask MK provides an opening OP.

Figure 3:
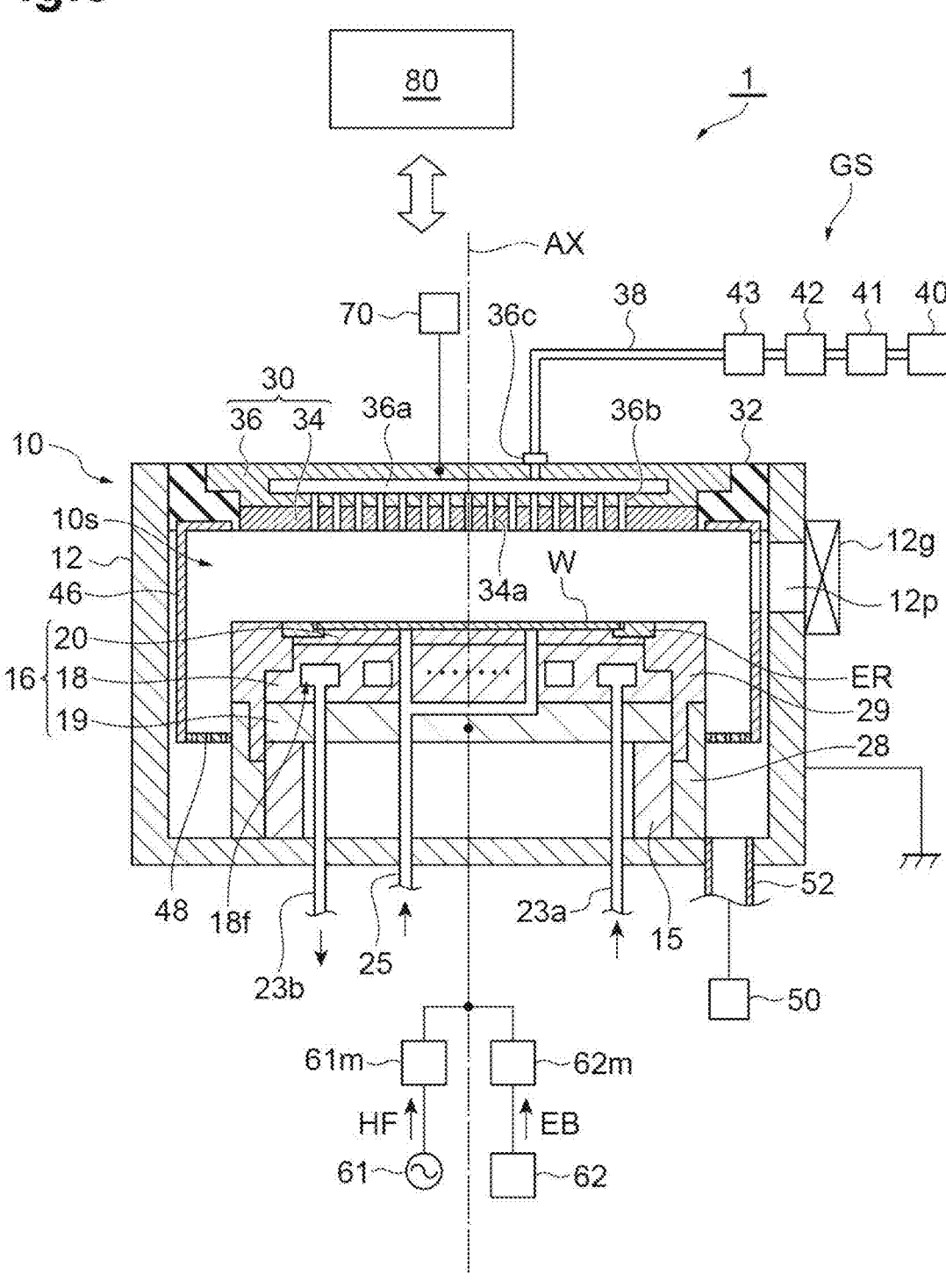
FIG. 3 schematically illustrates a plasma processing apparatus according to an exemplary embodiment.

In the method MT, a plasma processing apparatus is used. FIG. 3 schematically illustrates a plasma processing apparatus according to an exemplary embodiment. A plasma processing apparatus 1 shown in FIG. 3 is a capacitively coupled plasma processing apparatus.

The plasma processing apparatus 1 is provided with a chamber 10. The chamber 10 provides an internal space 10s therein. The central axis of the chamber 10 is an axis AX which extends in the vertical direction. In an embodiment, the chamber 10 includes a chamber body 12. The chamber body 12 has a substantially cylindrical shape. The internal space 10s is provided in the chamber body 12. The chamber body 12 is formed of, for example, aluminum. The chamber body 12 is electrically grounded. A film having corrosion resistance is provided on the inner wall surface of the chamber body 12. The film having corrosion resistance may be a film formed of ceramic such as aluminum oxide or yttrium oxide.

The chamber body 12 provides a passage 12p in the side wall thereof. The substrate W passes through the passage 12p when it is transferred between the internal space 10s and the outside of the chamber 10. The passage 12p is able to be opened and closed by a gate valve 12g. The gate valve 12g is provided along the side wall of the chamber body 12.

The plasma processing apparatus 1 is further provided with a substrate support 16. The substrate support 16 is configured to support the substrate W in the chamber 10. The substrate W may have a substantially disk shape. The substrate support 16 may be supported by a support 15. The support 15 extends upward from a bottom portion of the chamber body 12. The support 15 has a substantially cylindrical shape. The support 15 is formed of an insulating material such as quartz.

The substrate support 16 may include a lower electrode 18 and an electrostatic chuck 20. The substrate support 16 may further include an electrode plate 19. The electrode plate 19 is formed of a conductive material such as aluminum. The electrode plate 19 has a substantially disk shape, and the central axis thereof is the axis AX. The lower electrode 18 is provided on the electrode plate 19. The lower electrode 18 is formed of a conductive material such as aluminum. The lower electrode 18 has a substantially disk shape, and the central axis thereof is the axis AX. The lower electrode 18 is electrically connected to the electrode plate 19.

A flow path 18f is provided in the interior of the lower electrode 18. The flow path 18f is a flow path for a heat exchange medium (for example, a refrigerant). The flow path 18f receives the heat exchange medium from a supply device (for example, a chiller unit) through a pipe 23a. The supply device is provided outside the chamber 10. The heat exchange medium supplied to the flow path 18*f* flows through the flow path 18*f* and is then returned to the supply device through a pipe 23*b*. The supply device for the heat exchange medium configures a temperature adjusting mechanism of the plasma processing apparatus 1.

The electrostatic chuck 20 is provided on the lower electrode 18. The substrate W is placed on the upper surface of the electrostatic chuck 20. The electrostatic chuck 20 has a main body and an electrode. The main body of the electrostatic chuck 20 is formed of a dielectric. Each of the electrostatic chuck 20 and the main body thereof has a substantially disk shape, and the central axis thereof is the axis AX. The electrode of the electrostatic chuck 20 is an electrode having a film shape, and is provided in the main body of the electrostatic chuck 20. The electrode of the electrostatic chuck 20 is connected to a direct-current power source through a switch. When the voltage from the direct-current power source is applied to the electrode of the electrostatic chuck 20, an electrostatic attraction force is generated between the electrostatic chuck 20 and the substrate W. Due to the generated electrostatic attraction force, the substrate W is attracted to the electrostatic chuck 20 and held by the electrostatic chuck 20.

The substrate support 16 may further support an edge ring ER that is disposed thereon. The edge ring ER may be formed of silicon, silicon carbide, or quartz. The substrate W is disposed on the electrostatic chuck 20 and in a region surrounded by the edge ring ER.

The plasma processing apparatus 1 may be further provided with a gas supply line 25. The gas supply line 25 supplies a heat transfer gas (for example, a He gas) from a gas supply mechanism to a gap between the upper surface of the electrostatic chuck 20 and the rear surface (lower surface) of the substrate W.

The plasma processing apparatus 1 may further include a tubular part 28 and an insulating part 29. The tubular part 28 extends upward from the bottom portion of the chamber body 12. The tubular part 28 extends along the outer periphery of the support 15. The tubular part 28 is formed of a conductive material and has a substantially cylindrical shape. The tubular part 28 is electrically grounded. The insulating part 29 is provided on the tubular part 28. The insulating part 29 is formed of a material having insulation properties. The insulating part 29 is formed of ceramic such as quartz, for example. The insulating part 29 has a substantially cylindrical shape. The insulating part 29 extends along the outer periphery of the electrode plate 19, the outer periphery of the lower electrode 18, and the outer periphery of the electrostatic chuck 20.

The plasma processing apparatus 1 is further provided with an upper electrode 30. The upper electrode 30 is provided above the substrate support 16. The upper electrode 30 is supported on an upper portion of the chamber body 12 through a member 32. The member 32 is formed of a material having insulation properties. The upper electrode 30 and the member 32 close the upper opening of the chamber body 12.

The upper electrode 30 may include a ceiling plate 34 and a support 36. The lower surface of the ceiling plate 34 is a lower surface on the internal space 10*s* side and defines the internal space 10*s*. The ceiling plate 34 may be formed of a low resistance conductor or semiconductor with low Joule heat. In an embodiment, the ceiling plate 34 is formed of silicon. A plurality of gas holes 34*a* are provided in the ceiling plate 34. The plurality of gas holes 34*a* penetrate the ceiling plate 34 in a plate thickness direction thereof.

The support 36 detachably supports the ceiling plate 34. The support 36 is formed of a conductive material such as aluminum. The support 36 provides a gas diffusion chamber 36*a* in the interior thereof. The support 36 is further provided with a plurality of gas holes 36*b*. The plurality of gas holes 36*b* extend downward from the gas diffusion chamber 36*a*. The plurality of gas holes 36*b* communicate with the plurality of gas holes 34*a*, respectively. The support 36 is further provided with a gas introduction port 36*c*. The gas introduction port 36*c* is connected to the gas diffusion chamber 36*a*. A gas supply pipe 38 is connected to the gas introduction port 36*c*.

A gas source group 40 is connected to the gas supply pipe 38 through a valve group 41, a flow rate controller group 42, and a valve group 43. The gas source group 40, the valve group 41, the flow rate controller group 42, and the valve group 43 configure a gas supply GS. The gas source group 40 includes a plurality of gas sources. The plurality of gas sources of the gas source group 40 include sources of a plurality of gases that are used in the method MT. Each of the valve group 41 and the valve group 43 includes a plurality of on-off valves.

The flow rate controller group 42 includes a plurality of flow rate controllers. Each of the plurality of flow rate controllers of the flow rate controller group 42 is a mass flow controller or a pressure control type flow rate controller. Each of the plurality of gas sources of the gas source group 40 is connected to the gas supply pipe 38 through a corresponding on-off valve of the valve group 41, a corresponding flow rate controller of the flow rate controller group 42, and a corresponding on-off valve of the valve group 43.

The plasma processing apparatus I may be further provided with a shield 46. The shield 46 is detachably provided along the inner wall surface of the chamber body 12. The shield 46 prevents byproducts of the plasma processing from adhering to the chamber body 12. The shield 46 is configured, for example, by forming a film having corrosion resistance on the surface of a member made of aluminum. The film having corrosion resistance may be a film formed of ceramic such as yttrium oxide.

The plasma processing apparatus 1 may be further provided with a baffle member 48. The baffle member 48 is provided between a member (for example, the tubular part 28) that surrounds the substrate support 16, and the shield 46. The baffle member 48 is configured, for example, by forming a film having corrosion resistance on the surface of a member made of aluminum. The film having corrosion resistance may be a film formed of ceramic such as yttrium oxide. A plurality of through-holes are provided in the baffle member 48. An exhaust port is provided below the baffle member 48 and in the bottom portion of the chamber body 12. An exhaust device 50 is connected to the exhaust port through an exhaust pipe 52. The exhaust device 50 has a pressure adjusting valve, and a vacuum pump such as a turbo molecular pump.

The plasma processing apparatus 1 is further provided with a radio frequency power source 61 and a bias power source 62. The radio frequency power source 61 is configured to generate radio frequency power (hereinafter referred to as "radio frequency power HF"). The radio frequency power HF has a frequency suitable for the generation of plasma. The frequency of the radio frequency power. HF is, for example, 27 MHz or higher and 100 MHz or lower. The radio frequency power source 61 is connected to the lower electrode 18 through a matcher 61*m*. The matcher 61*m* has a circuit for matching the impedance on the load side (the lower electrode 18 side) of the radio frequency power source 61 with the output impedance of the radio frequency power source 61. In an embodiment, the radio frequency power source 61 may configure a plasma generator. The radio frequency power source 61 may be connected to the upper electrode 30 through the matcher 61*m*.

The bias power source 62 is configured to supply an electric bias EB to the lower electrode 18. The electric bias EB has a frequency suitable for drawing ions into the substrate W. The frequency of the electric bias EB is, for example, 100 kHz or higher and 40.68 MHz or lower. In a case where the electric bias EB is used together with the radio frequency power HF, the electric bias EB has a frequency lower than the frequency of the radio frequency power HF.

In an embodiment, the electric bias EB may be radio frequency bias power (hereinafter referred to as "radio frequency power LF"). In the present embodiment, the bias power source 62 is connected to the lower electrode 18 through a matcher 62*m*. The matcher 62*m* has a circuit for matching the impedance on the load side (the lower electrode 18 side) of the bias power source 62 with the output impedance of the bias power source 62. The plasma processing apparatus 1 may be configured to generate plasma by using only the radio frequency power LF. In this case, the bias power source 62 configures the plasma generator in an embodiment. In this case, the plasma processing apparatus 1 does not need to be provided with the radio frequency power source 61 and the matcher 61*m*.

In an embodiment, the electric bias EB may be a pulse of voltage. In the present embodiment, the pulse of voltage is periodically applied to the lower electrode 18. The pulse of voltage may have any polarity as long as the potential of the substrate W can be set such that ions from the plasma can be drawn into the substrate W. The pulse of voltage may have a negative polarity or may be a negative direct-current voltage. The pulses of voltage may have any waveform such as a square wave, a triangular wave, or other waveforms.

The plasma processing apparatus 1 may be further provided with a power source 70. The power source 70 is electrically connected to the upper electrode 30. The power source 70 is configured to apply a negative voltage, for example, a negative direct-current voltage, to the upper electrode.

The plasma processing apparatus 1 is further provided with a controller 80. The controller 80 is a computer which includes a processor, a storage device, an input device, a display device, and the like, and controls each part of the plasma processing apparatus 1. Specifically, the controller 80 executes a control program stored in the storage device and controls each part of the plasma processing apparatus 1, based on recipe data stored in the storage device. A process designated by the recipe data is performed in the plasma processing apparatus 1 under the control by the controller 80. The method MT can be performed in the plasma processing apparatus 1 by the control of each part of the plasma processing apparatus 1 by the controller 80.

Figure 4:
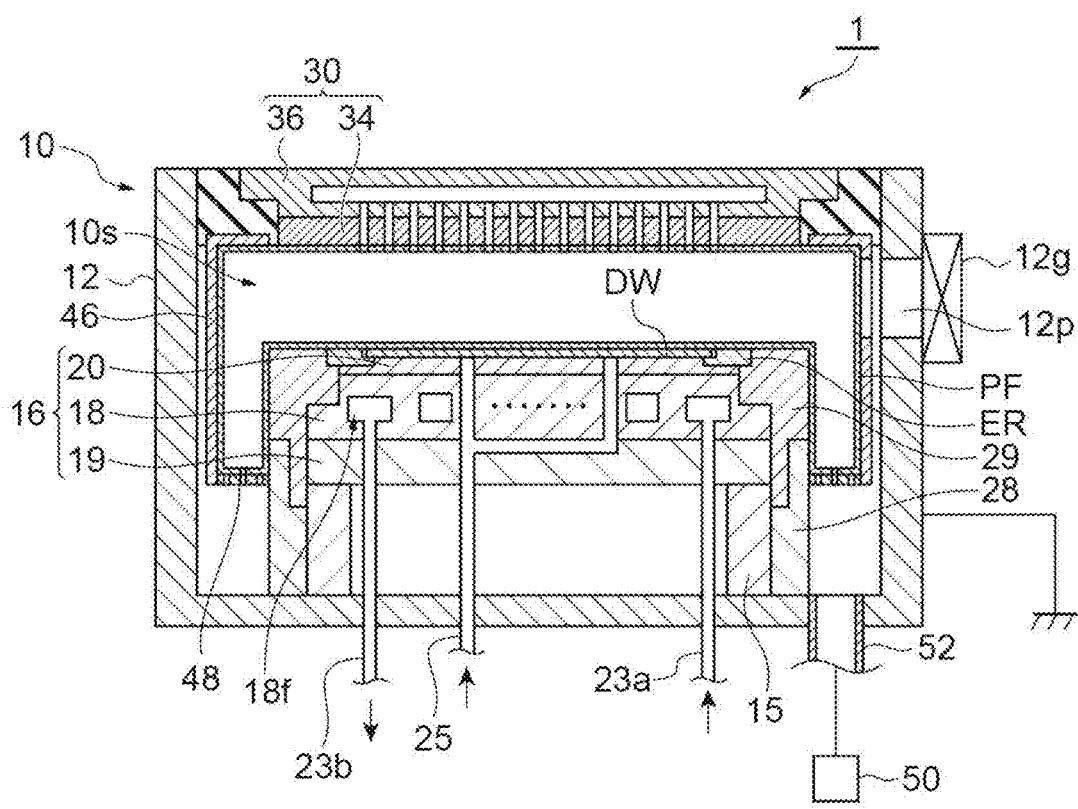
FIG. 4 illustrates a state where a protective film is formed on a surface in a chamber of the plasma processing apparatus according to an exemplary embodiment.
Figure 5:
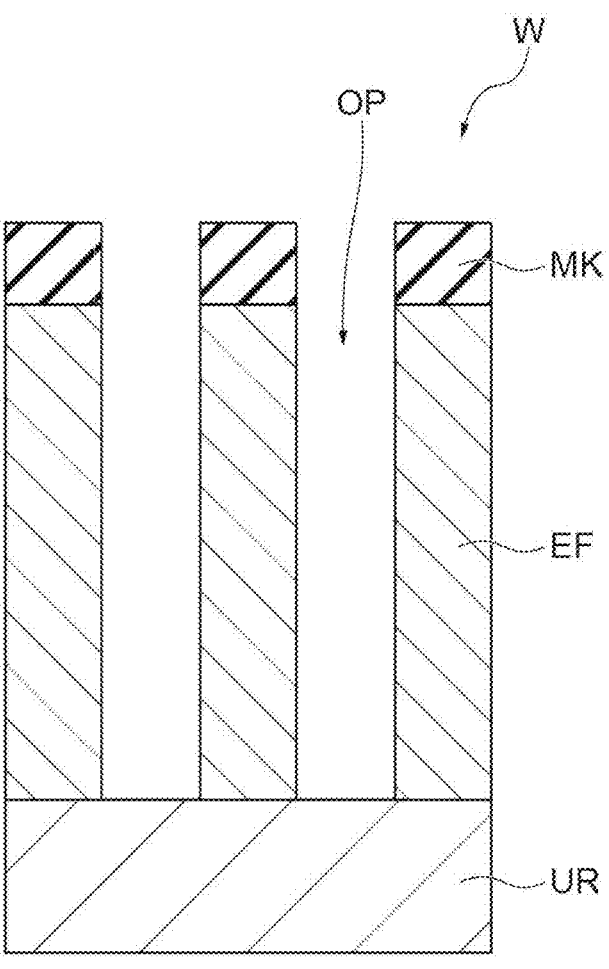
FIG. 5 is a partially enlarged sectional view of a substrate of an example in a state after etching is performed.
Figure 6:
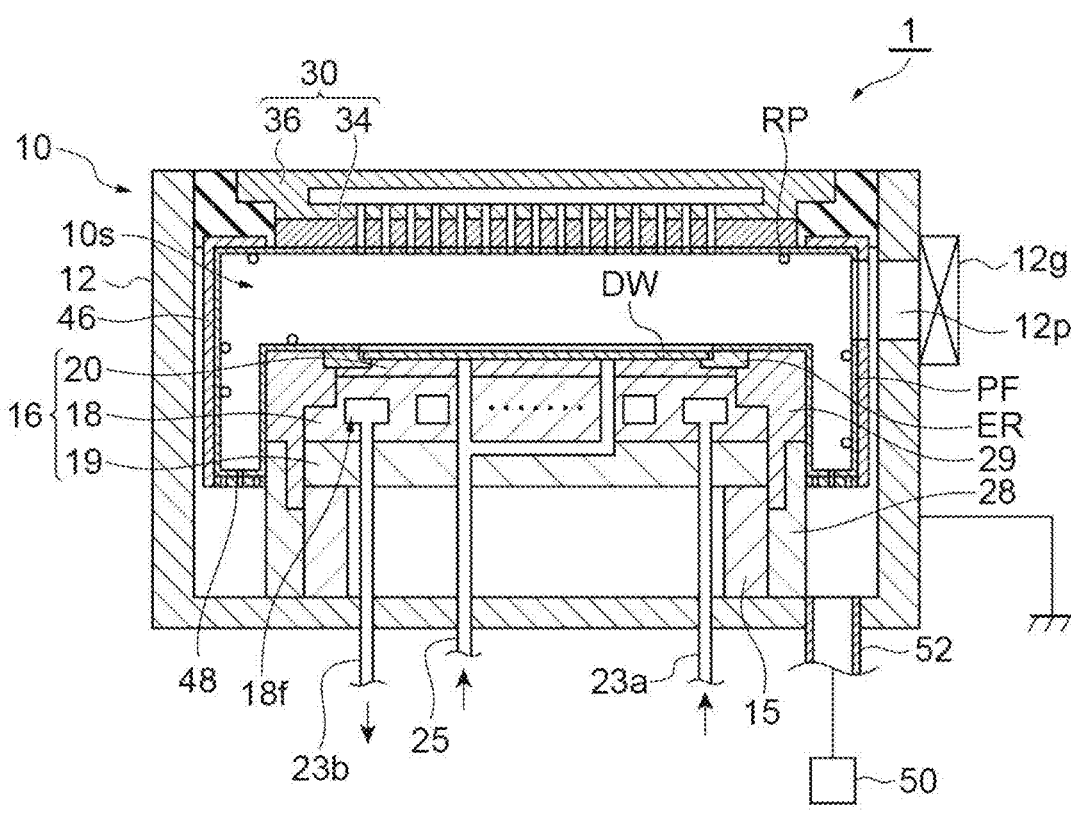
FIG. 6 illustrates the state of the chamber after etching is performed in the plasma processing apparatus according to an exemplary embodiment.
Figure 7:
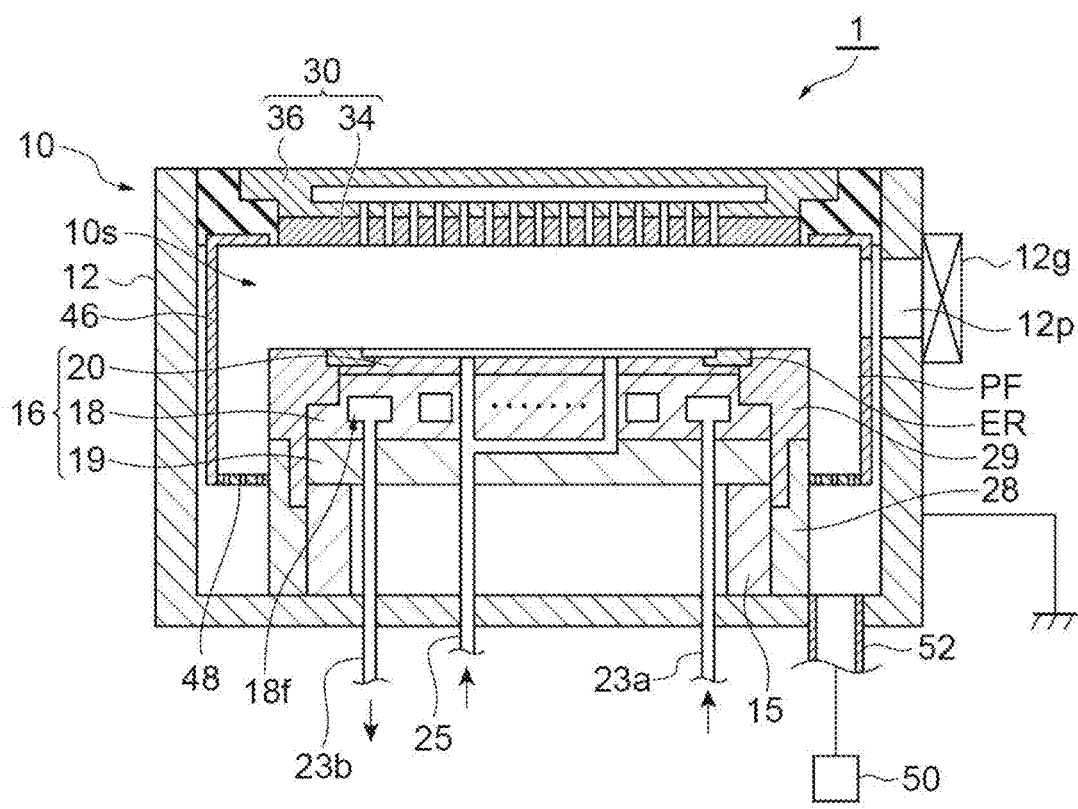
FIG. 7 illustrates the state of the chamber after dry cleaning is performed in the plasma processing apparatus according to an exemplary embodiment.

The method MT will be described in detail with reference to FIG. 1 again. Hereinafter, the method MT will be described by taking a case where the method MT is applied to the substrate W shown in FIG. 2 by using the plasma processing apparatus 1 as an example. In the following description, FIGS. 4 to 7 will be further referred to. FIG. 4 illustrates a state where a protective film is formed on a surface in a chamber of the plasma processing apparatus according to an exemplary embodiment. FIG. 5 is a partially enlarged sectional view of a substrate of an example in a state after etching is performed. FIG. 6 illustrates the state of the chamber after etching is performed in the plasma processing apparatus according to an exemplary embodiment. FIG. 7 illustrates the state of the chamber after dry cleaning is performed in the plasma processing apparatus according to an exemplary embodiment.

As shown in FIG. 1, the method MT includes step STa and step STb. In step STa, a protective film PF is formed on the surface in the chamber 10. The surface in the chamber 10 is a surface to which a reaction product that is generated in the etching of step STb may adhere unless the protective film PF is formed on the surface in step STa. In an example, the surface in the chamber 10 includes the lower surface of the upper electrode 30 (that is, the lower surface of the ceiling plate 34), the surface of the shield 46, the surface of the insulating part 29, and the surface of the edge ring ER. In step STb, the film EF of the substrate W is etched.

The method MT may further include one or more steps among step STm, step STv, step STr, and step STc. Step STm is performed before step STa. In step STm, the surface in the chamber 10 is modified. According to step STm, the adhesion of the protective film PF to the surface in the chamber 10 is improved.

In step STm, plasma of a noble gas may be generated in the chamber 10 after chamber cleaning is performed. The noble gas may include one or more among plural types of noble gases such as an Ar gas, a Kr gas, and a Xe gas. In step STm, a bias voltage may be applied to the upper electrode 30 to draw ions from the plasma generated from the noble gas into the upper electrode 30. The bias voltage may be the voltage (for example, a negative voltage) from the power source 70. In step STm, chemical species such as ions from the noble gas plasma are supplied to the surfaces in the chamber 10, so that the surface in the chamber 10 is modified.

In step STm, the controller 80 controls the gas supply GS to supply the noble gas into the chamber 10. The controller 80 controls the exhaust device 50 to set the pressure of the gas in the chamber 10 to a designated pressure. The controller 80 controls the plasma generator to generate plasma of the noble gas in the chamber 10. In the plasma processing apparatus 1, the controller 80 controls the radio frequency power source 61 and/or the bias power source 62 to supply the radio frequency power HF and/or the electric bias EB. Further, in step STm, the controller 80 may further control the power source 70 to apply a voltage to the upper electrode 30.

In step STa, the protective film PF is formed on the surface in the chamber 10, as shown in FIG. 4. The protective film PF may have a thickness in the range of 50 nm to 200 nm, for example a thickness of about 100 nm. As shown in FIG. 4, step STa may be performed in a state where a dummy substrate DW is placed on the substrate support 16.

The protective film PF may be formed of the same type of material as a material of the mask MK. In a case where the mask MK is formed of a carbon-containing film, the protective film PF may be formed of a carbon-containing substance. In a case where the mask MK is formed of a silicon-containing film, the protective film PF may be formed of a silicon-containing substance (for example, polycrystalline silicon, silicon oxide, or a silicon-containing film containing carbon). The silicon-containing film containing carbon is, for example, silicon carbide. In a case where the mask MK is formed of a metal-containing film, the protective film PF may be formed of a metal-containing substance. The metal-containing substance includes any one among titanium, titanium nitride, titanium carbide, titanium oxide, tungsten, tungsten carbide, ruthenium, ruthenium oxide, molybdenum, molybdenum carbide, and the like.

The protective film PF may be formed by using a film-forming gas within the chamber 10. The film-forming gas that is used to form the protective film PF made of a carbon-containing substance includes a carbon-containing gas. The film-forming gas may be a gas that does not contain fluorine. The carbon-containing gas includes one or more among a CO gas, a $CO_2$ gas, a COS gas, and a hydrocarbon gas. The hydrocarbon gas is a $CH_4$ gas, a $C_2H_2$ gas, a $C_3H_6$ gas, or the like. The protective film PF made of a carbon-containing substance may be formed by a chemical vapor deposition (CVD) method or a molecular layer deposition (MLD) method. The CVD method may be a plasma-enhanced CVD method or a thermal CVD method. The MLD method may be a plasma-enhanced MLD method or a thermal MLD method. In the MLD method, a protective film having a urea bond may be formed by mixing two or more types of gases.

In step STa, the controller 80 controls the gas supply GS to supply the film-forming gas into the chamber 10 to form the protective film PF made of a carbon-containing substance. The controller 80 controls the exhaust device 50 to set the pressure of the gas in the chamber 10 to a designated pressure. The controller 80 controls the plasma generator to generate plasma of the film-forming gas within the chamber 10. In the plasma processing apparatus 1, the controller 80 controls the radio frequency power source 61 and/or the bias power source 62 to supply the radio frequency power HF and/or the electric bias EB.

The protective film PF made of a silicon-containing substance is formed by using a CVD method, an atomic layer deposition (ALD) method, a molecular layer deposition method, or a sputter deposition method. The CVD method may be a plasma-enhanced CVD method or a thermal CVD method. The ALD method may be a plasma-enhanced ALD method or a thermal ALD method. In a case of forming the protective film PF made of a silicon-containing substance, the film-forming gas includes, for example, a $SiH_4$ gas, a $SiCl_4$ gas, a $Si_2Cl_6$ gas, or a $SiF_4$ gas. The film-forming gas may further include a noble gas such as argon. In a case of forming the protective film PF made of silicon oxide, the film-forming gas may further include an oxygen-containing gas containing oxygen that reacts with a precursor. In a case of forming the protective film PF made of silicon carbide, the film-forming gas may further include the carbon-containing gas as described above.

The controller 80 controls the gas supply GS to supply the film-forming gas into the chamber 10 to form the protective film PF made of a silicon-containing substance in step STa. The controller 80 controls the exhaust device 50 to set the pressure of the gas in the chamber 10 to a designated pressure. The controller 80 may control the plasma generator to generate plasma of the film-forming gas within the chamber 10. In the plasma processing apparatus 1, the controller 80 may control the radio frequency power source 61 and/or the bias power source 62 to supply the radio frequency power HF and/or the electric bias EB.

The protective film PF made of a metal-containing substance is formed by using a chemical vapor deposition method, a metalorganic chemical vapor deposition (MOCVD) method, or an atomic layer deposition (ALD) method. In a case of using these film-forming methods, the film-forming gas containing a metal-containing substance as a precursor is supplied into the chamber 10. The film-forming gas contains, for example, $WF_6$, $TiCl_4$, $C_8H_{24}N_4Ti$, $RuCl_3$, or $MoCl_5$. The controller 80 controls the gas supply GS to supply the film-forming gas into the chamber 10 to form the protective film PF made of a metal-containing substance in step STa.

In a case where the protective film PF is formed of tungsten, the film-forming gas may contain $WF_6$. The film-forming gas is supplied into the chamber 10 such that $WF_6$ that is a precursor is adsorbed to the surface in the chamber 10. $WF_6$ is modified by the chemical species from plasma of a hydrogen-containing gas (for example, an $H_2$ gas) that is generated within the chamber 10. As a result, the protective film PF made of tungsten is formed on the surface in the chamber 10. Alternatively, the protective film PF made of tungsten may be formed by a plasma-enhanced CVD method or a thermal CVD method using a film-forming gas containing $WF_6$.

In a case where the protective film PF is formed of titanium, the film-forming gas contains, for example, $TiCl_4$ and Hz, and the protective film PF is formed by a plasma-enhanced CVD method or a thermal CVD method. In a case where the protective film PF is formed of titanium nitride, the film-forming gas contains, for example, $TiCl_4$ and $N_2$, and the protective film PF is formed by a plasma-enhanced CVD method or a thermal CVD method. Alternatively, in a case where the protective film PF is formed of titanium nitride, the film-forming gas contains, for example, $Ti[N(CH_3)C_2H_5]_4$, and the protective film PF is formed by an MOCVD method.

In an embodiment, step STv may be performed during the execution of step STa or after step STa and before step STb. In step STv, a negative voltage (for example, a negative direct-current voltage) is applied from the power source 70 to the upper electrode 30. In a case where step STv is performed after step STa and before step STb, a negative voltage (for example, a negative direct-current voltage) may be applied from the power source 70 to the upper electrode 30 in a state where plasma of an inert gas is being generated in the chamber 10. The inert gas may include, for example, one or more of a noble gas and a hydrogen gas. In step STv, the rearrangement of crystals in the protective film PF may be promoted by heat input from plasma, for example. Alternatively or additionally, in step STv, ions from plasma collide with the protective film PF, so that impurities (for example, hydrogen or its molecules or a halogen element or molecules containing halogen element) may be removed from the protective film PF. Therefore, in this step, the protective film PF is densified. In step STv, the power source 70 is controlled by the controller 80.

In an embodiment, step STr may be performed after step STa and before step STb. Step STr may be performed after step STv. In step STr, roughening treatment of the surface of the protective film PF is performed. According to step STr, the adhesion of the reactive species generated in step STb to the surface of the protective film PF is enhanced. In step STr, plasma may be generated from a hydrogen gas within the chamber 10.

In step STr, the controller 80 controls the gas supply GS to supply a hydrogen gas into the chamber 10. The controller 80 controls the exhaust device 50 to set the pressure of the gas in the chamber 10 to a designated pressure. The controller 80 may control the plasma generator to generate plasma of a hydrogen gas within the chamber 10. In the plasma processing apparatus 1, the controller 80 may control the radio frequency power source 61 and/or the bias power source 62 to supply the radio frequency power HF and/or the electric bias EB.

In the method MT, subsequently, the substrate W is placed on the substrate support 16. Then, step STb is performed. In step STb, the film EF is etched as shown in FIG. 5. Due to the etching of the film EF in step STb, the depth of the opening OP increases. In step STb, the film EF may be etched to a state where the underlying region UR is exposed.

In step STb, the firm EF is etched by using hydrogen fluoride within the chamber 10. In step STb, an etching gas is supplied into the chamber 10, and plasma is generated from the etching gas within the chamber 10, to produce the hydrogen fluoride.

The etching gas may include a hydrogen fluoride (HF) gas. In an embodiment, the etching gas may further include a hydrofluorocarbon gas in addition to the hydrogen fluoride gas. The hydrofluorocarbon gas may include one or more substances among $C_4H_2F_6$, $CH_2F_2$, $CH_3F$, $CHF_3$, and the like. The etching gas may further include a hydrogen-containing gas in addition to the hydrogen fluoride gas. The hydrogen-containing gas may include at least one selected from the group consisting of $H_2$, $CH_4$, $C_4H_2F_6$, $CH_2F_2$, $CH_3F$, $CHF_3$, $H_2O$, HBr, and HI.

Alternatively, the etching gas may include a fluorine-containing gas that is a fluorine source, and a hydrogen-containing gas that is a hydrogen source. The etching gas may contain one or more substances among $H_2$, $CH_4$, $C_2H_2$, $CH_2F_2$, $CH_3F$, $CHF_3$, $H_2O$, HF, HCl, HBr, HI, and the like, as a hydrogen source. The etching gas may contain one or more substances among $CF_4$, $C_4F_8$, $C_4F_6$, $C_3F_8$, $C_5F_8$, $SF_6$, $NF_3$, $XeF_2$, $PF_3$, $PF_5$, $CF_3I$, $C_2F_5I$, $C_3F_7I$, $IF_5$, $IF_7$, $WF_6$, HF, $SiF_4$, and the like, as a fluorine source.

The etching gas may further contain one or more phosphorus-containing molecules. One or more phosphorus-containing molecules may contain oxides such as tetraphosphorus pentoxide ($P_4O_{10}$), tetraphosphorus octoxide ($P_4O_8$), and tetraphosphorus hexaoxide ($P_4O_6$). The tetraphosphorus pentoxide is sometimes called diphosphorus pentoxide ($P_2O_5$). One or more phosphorus-containing molecules may contain halides such as phosphorus trifluoride ($PF_3$), phosphorus pentafluoride ($PF_5$), phosphorus trichloride ($PCl_3$), phosphorus pentachloride ($PCl_5$), phosphorus tribromide ($PBr_3$), phosphorus pentabromide ($PBr_5$), and phosphorus iodide ($PI_3$). One or more phosphorus-containing molecules may contain halogenated phosphoryl such as phosphoryl fluoride ($POF_3$), phosphoryl chloride ($POCl_3$), and phosphoryl bromide ($POBr_3$). One or more phosphorus-containing molecules may contain phosphine ($PH_3$), calcium phosphide ($Ca_3P_2$ or the like), phosphoric acid ($H_3PO_4$), sodium phosphate ($Na_3PO_4$), a hexafluorophosphoric acid ($HPF_6$), and the like. One or more phosphorus-containing molecules may contain fluorophosphine ($H_xPF_y$). Here, the sum of x and y is 3 or 5. As the fluorophosphine, $HPF_2$ and $H_2PF_3$ are exemplified.

In an example, the etching gas may be a mixed gas containing a hydrogen fluoride gas, a fluorocarbon gas such as a $C_4F_8$ gas, and a phosphorus-containing gas. The phosphorus-containing gas contains the one or more phosphorus-containing molecules described above.

The controller 80 controls the gas supply GS to supply etching gas into the chamber 10 to etch the film EF in step STb. The controller 80 controls the exhaust device 50 to set the pressure of the gas in the chamber 10 to a designated pressure. The controller 80 controls the plasma generator to generate plasma of the etching gas within the chamber 10. In the plasma processing apparatus 1, the controller 80 controls the radio frequency power source 61 and/or the bias power source 62 to supply the radio frequency power HF and/or the electric bias EB, In step STb, the supply device for the heat exchange medium may be controlled by the controller 80 such that the temperature of the heat exchange medium that is supplied to the flow path 18f is a temperature of −20° C. or lower.

When the etching in step STb is performed, a reaction product RP (reactive species) is produced. The reaction product RP may include a substance containing fluorine and carbon. The reaction product RP adheres to the surface in the chamber 10, as shown in FIG. 6.

In the method MT, the substrate W is carried out from the inside of the chamber 10 after step STb. Then, step STc is performed. In step STc, dry cleaning of the chamber 10 is performed. The dry cleaning in step STc may be performed in a state where a dummy substrate is placed or is not placed on the substrate support 16.

In step STc, a cleaning gas is supplied into the chamber 10 and plasma is generated from the cleaning gas. The reaction product RP is removed together with at least a part of the protective film PF by the generated chemical species from the cleaning gas. The dry cleaning in step STc may completely remove the protective film PF, as shown in FIG. 7. Alternatively, the dry cleaning in step STc may be performed such that the protective film PF partially remains in a state where the protective film PF covers the surface in the chamber 10.

In a case where the protective film PF is made of a carbon-containing substance, an oxygen-containing gas (for example, an $O_2$ gas) is used as the cleaning gas. In a case where the protective film PF is made of a silicon-containing substance, a halogen-containing gas is used as the cleaning gas. In a case where the protective film PF is made of a metal-containing substance, the cleaning gas contains $NF_3$, $Cl_2$, $BCl_3$, $SiCl_4$, $O_2$, $CH_3OH$, $C_2H_5OH$, or the like.

In order to perform the dry cleaning in step STc, the controller 80 controls the gas supply GS to supply the cleaning gas into the chamber 10. The controller 80 controls the exhaust device 50 to set the pressure of the gas in the chamber 10 to a designated pressure. The controller 80 controls the plasma generator to generate plasma of the cleaning gas within the chamber 10. In the plasma processing apparatus 1, the controller 80 controls the radio frequency power source 61 and/or the bias power source 62 to supply the radio frequency power HF and/or the electric bias EB.

The method MT may further include step STJ. In step STJ, it is determined whether or not a stop condition is satisfied. The stop condition is not satisfied in a case where there is a substrate to be further etched. On the other hand, the stop condition is satisfied in a case where the etching for all the substrates is completed.

When a determination that the stop condition is not satisfied is made in step STJ, the processing is continued for the etching of another substrate W. In a case where the protective film PF has been removed by the dry cleaning in step STc to expose the surface in the chamber 10, step STa is performed again. Thereafter, another substrate W is placed on the substrate support 16 and step STb is performed. Alternatively, in a case where the protective film PF remains to cover the surface in the chamber 10 after the dry cleaning in step STc, another substrate W is placed on the substrate support 16 without performing step STa, and then, step STb is performed. When a determination that the stop condition is satisfied is made in step STJ, the method MT is ended.

In the method MT, the protective film PF is formed on the surface in the chamber 10 before the etching of the film EF. Since the protective film PF is formed of the same type of material (for example, a carbon-containing material) as the material of the mask MK, it is resistant to the etching.

Therefore, according to the method MT, it becomes possible to more effectively protect the surface in the chamber 10 from the reactive species. As a result, corrosion of the surface in the chamber 10 due to the etching in step STb is prevented. Furthermore, a temporal change of the process (step STb) is prevented. Further, according to the method MT, since the surface in the chamber 10 is protected by the protective film PF, a sputtering resistant effect of the surface in the chamber 10 can be obtained, and scattering of particles of the material configuring the surface in the chamber 10 can be prevented.

Figure 8:
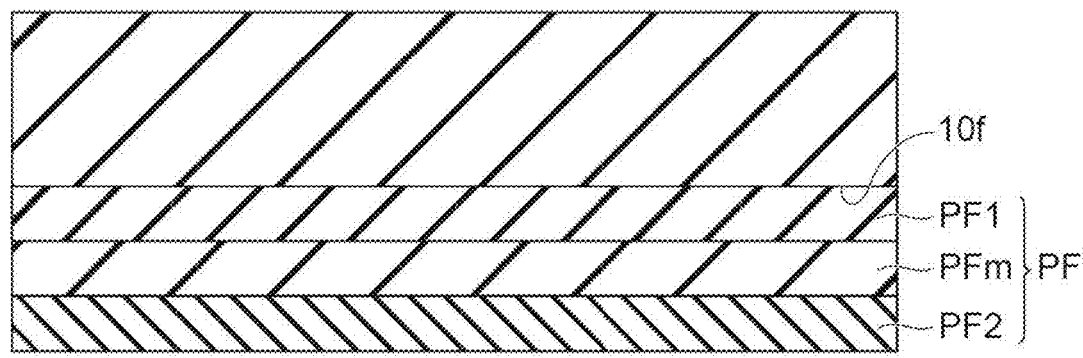
FIG. 8 is a sectional view illustrating a protective film according to another exemplary embodiment.

Hereinafter, FIG. 8 will be referred to. FIG. 8 is a sectional view illustrating a protective film according to another exemplary embodiment. The protective film PF may be a laminated film that includes two or more different films. In an embodiment, the protective film PF may include a first film PF1 and a second film PF2. The first film PF1 is formed on a surface 10f in the chamber 10 (for example, the lower surface of the ceiling plate 34). The second film PF2 is formed on the first film PF1.

The first film PF1 may be formed of silicon or silicon carbide. The second film PF2 may contain carbon. With respect to a method of forming the film formed of silicon or silicon carbide and the film containing carbon in step STa, the above description is referred to. In an example, the first film PF1 is formed by a CVD method using a film-forming gas that includes a $SiCl_4$ gas and an $H_2$ gas, a film-forming gas that includes a $SiH_4$ gas, or a film-forming gas that includes a $SiH_4$ gas and a carbon-containing gas (for example, a hydrocarbon gas such as a $CH_4$ gas). In an example, the second film PF2 is formed by a CVD method using a film-forming gas that includes a carbon-containing gas (for example, a hydrocarbon gas such as a $CH_4$ gas).

The protective film PF may further include an intermediate film PFm provided between the first film PF1 and the second film PF2. In this case, the first film PF1 may be formed of silicon, the intermediate film PFm may be formed of silicon carbide, and the second film PF2 may contain carbon. With respect to a method of forming the film formed of silicon, the film formed of silicon carbide, and the film containing carbon in step STa, the above description is referred to. In an example, the first film PF1 is formed by a CVD method using a film-forming gas that includes a $SiCl_4$ gas and an $H_2$ gas, or a film-forming gas that includes a $SiH_4$ gas. In an example, the intermediate film PFm is formed by a CVD method using a film-forming gas that includes a $SiH_4$ gas and a carbon-containing gas (for example, a hydrocarbon gas such as a $CH_4$ gas). In an example, the second film PF2 is formed by a CVD method using a film-forming gas that includes a carbon-containing gas (for example, a hydrocarbon gas such as a $CH_4$ gas).

Figure 9A:
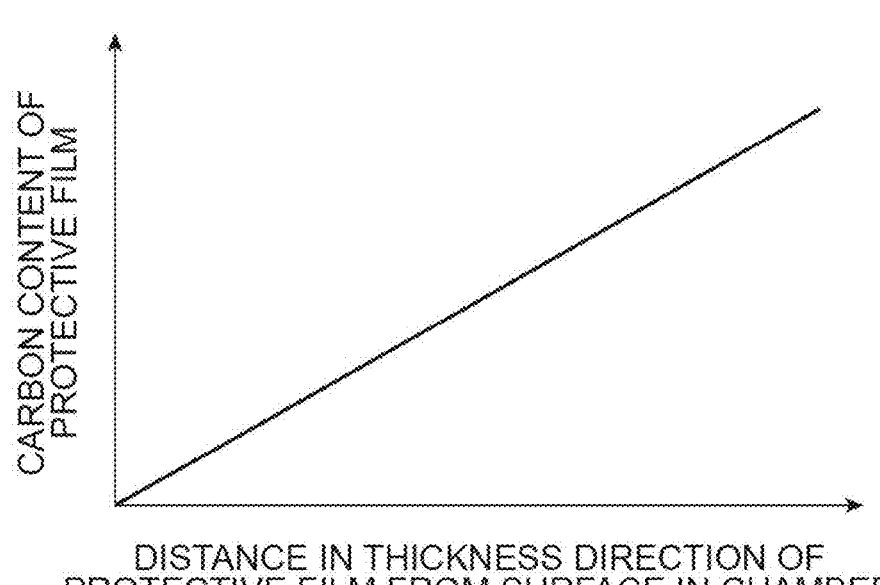
FIG. 9A illustrates an example of carbon content distribution in a thickness direction of a protective film according to still another exemplary embodiment.
Figure 9B:
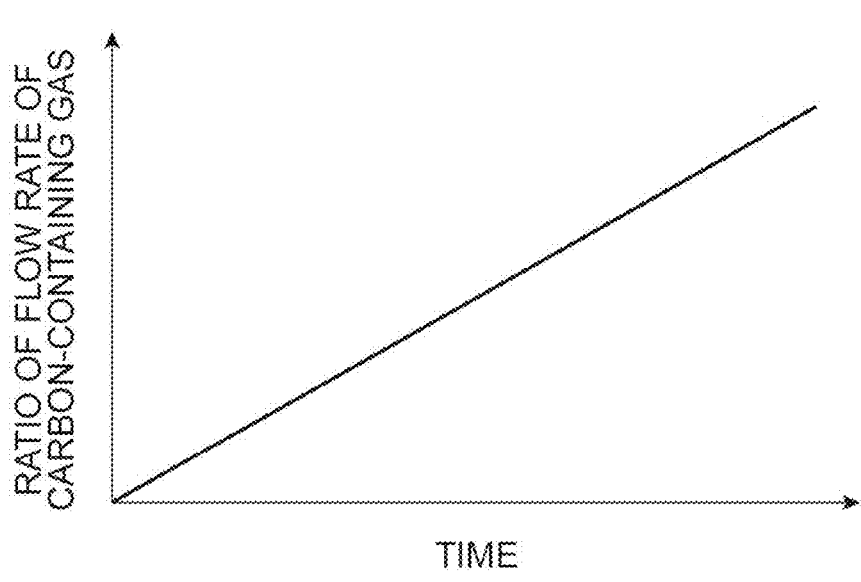
FIG. 9B illustrates an example of the ratio of a flow rate of a carbon-containing gas to the total flow rate of a film-forming gas for forming a protective film.

Hereinafter, FIGS. 9A and 9B will be referred to. FIG. 9A illustrates an example of carbon content distribution in a thickness direction of a protective film according to still another exemplary embodiment, and FIG. 9B illustrates an example of the ratio of a flow rate of a carbon-containing gas to the total flow rate of a film-forming gas for forming a protective film. In FIG. 9A, the horizontal axis indicates the distance in the thickness direction of the protective film PF from the surface in the chamber 10, and the vertical axis indicates the carbon content (or carbon concentration) of the protective film PF. In FIG. 9B, the horizontal axis indicates time within the period of step STa, and the vertical axis indicates the ratio of the flow rate of the carbon-containing gas to the total flow rate of the film-forming gas that is used in step STa.

In an embodiment, the protective film PF contains silicon and carbon. As shown in FIG. 9A, the carbon content (or carbon concentration) in the protective film PF may increase with an increase in the distance from the surface in the chamber 10. The silicon content (or silicon concentration) in the protective film PF may decrease with an increase in the distance from the surface in the chamber 10.

In step STa, the protective film PF is formed by a CVD method using a film-forming gas that includes a silicon-containing gas such as a $SiH_4$ gas and a carbon-containing gas (for example, a hydrocarbon gas such as a $CH_4$ gas). In step STa, as shown in FIG. 9B, the ratio of the flow rate of the carbon-containing gas to the total flow rate of the film-forming gas may be increased with time. The ratio of the flow rate of the silicon-containing gas to the total flow rate of the film-forming gas may be decreased with time in step STa.

While various exemplary embodiments have been described above, various additions, omissions, substitutions and changes may be made without being limited to the exemplary embodiments described above. Elements of the different embodiments may be combined to form another embodiment.

For example, the plasma processing apparatus that is used for the method MT may be a capacitively coupled plasma processing apparatus different from the plasma processing apparatus 1. The plasma processing apparatus that is used for the method MT may be a plasma processing apparatus of a type different from the capacitively coupled type. Such a plasma processing apparatus is, for example, an inductively coupled plasma processing apparatus, an electron cyclotron resonance (ECR) plasma processing apparatus, or a plasma processing apparatus that generates plasma from a gas by surface waves such as microwaves.

Further, the upper electrode 30 may be heated by a heater while step STa is being performed, that is, during the formation of the protective film PF. For example, the upper electrode 30 may be heated to 150° C. in step STa.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An etching method comprising:

forming a protective film containing carbon on a surface in a chamber of a plasma processing apparatus prior to placing a substrate within the chamber; and placing the substrate within the chamber and etching an etch film of the substrate with plasma generated from an etching gas including a hydrogen fluoride gas and a hydrofluorocarbon gas within the chamber, wherein the substrate includes:

the etch film, which is a silicon-containing film; and a mask containing carbon provided on the etch film, the protective film is formed using a film-forming gas, the protective film including:

a first film containing silicon; and a second film containing carbon formed on the first film, the method further comprises:

forming the first film by plasma-enhanced chemical vapor deposition (CVD) using a gas that includes:

$SiCl_4$ and $H_2$; and forming the second film by plasma-enhanced CVD using $CH_4$ gas, the plasma processing apparatus is a capacitively coupled plasma processing apparatus, and includes a substrate support provided within the chamber and an upper electrode provided above the substrate support, and the method further comprises applying a negative direct-current voltage to the upper electrode in a state where plasma of an inert gas is being generated in the chamber, after forming the protective film and before placing the substrate within the chamber.

2. The etching method according to claim 1, wherein the protective film has a carbon content that increases according to a distance in a thickness direction thereof from the surface in the chamber.

3. The etching method according to claim 2, wherein in the forming of the protective film, a ratio of a flow rate of the $CH_4$ gas to a total flow rate of the film-forming gas is increased with time.

4. The etching method according to claim 1, wherein a surface of the upper electrode on a side of an internal space of the chamber is provided by a ceiling plate formed of silicon.

5. The etching method according to claim 1, further comprising:

modifying the surface in the chamber before forming the protective film.

6. The etching method according to claim 5, wherein the modifying the surface in the chamber is performed, after chamber cleaning, and by generating plasma from a noble gas within the chamber.

7. The etching method according to claim 1, further comprising:

performing roughening treatment of a surface of the protective film after forming the protective film and before placing the substrate within the chamber to enhance adhesion of reactive species generated in the etching of the etch film.

8. The etching method according to claim 7, wherein plasma is generated from a hydrogen gas within the chamber during performing the roughening treatment of the surface of the protective film.

9. An etching method comprising:

forming a protective film containing carbon on a surface in a chamber of a plasma processing apparatus prior to placing a substrate within the chamber; and then placing the substrate within the chamber and etching an etch film of the substrate with plasma generated from an etching gas containing a hydrogen fluoride gas and a hydrogen-containing gas within the chamber, wherein the substrate includes the etch film, and a mask provided on the etch film, the protective film is formed of a same type of material as a material of the mask, the forming the protective film includes forming:

a first film containing silicon; and a second film containing carbon formed on the first film, the method further comprises:

forming the first film by plasma-enhanced chemical vapor deposition (CVD) using a gas that includes: $SiCl_4$ and $H_2$; and forming the second film by plasma-enhanced CVD using $CH_4$ gas, the second film being comprised of a material different from a material of the first film, the plasma processing apparatus is a capacitively coupled plasma processing apparatus, and includes a substrate support provided within the chamber and an upper electrode provided above the substrate support, and the method further comprises applying a negative direct-current voltage to the upper electrode in a state where plasma of an inert gas is being generated in the chamber, after forming the protective film and before placing the substrate within the chamber.

10. The etching method according to claim 9, wherein the hydrogen-containing gas includes at least one selected from a group consisting of $H_2$, $CH_4$, $C_2H_2$, $C_4H_2F_6$, $CH_2F_2$, $CH_3F$, $CHF_3$, $H_2O$, HCl, HBr, and HI.

11. The etching method according to claim 9, wherein a surface of the upper electrode on a side of an internal space of the chamber is provided by a ceiling plate formed of silicon.

12. The etching method according to claim 9, further comprising:

modifying the surface in the chamber before forming the protective film.

13. The etching method according to claim 9, further comprising:

performing roughening treatment of a surface of the protective film after forming the protective film and before placing the substrate within the chamber to enhance adhesion of reactive species generated in the etching of the etch film.

* * * * *